United States Patent
Kanzawa et al.

(10) Patent No.: US 6,649,496 B2
(45) Date of Patent: Nov. 18, 2003

(54) PRODUCTION METHOD FOR SEMICONDUCTOR CRYSTAL

(75) Inventors: Yoshihiko Kanzawa, Kadoma (JP); Katsuya Nozawa, Osaka (JP); Tohru Saitoh, Settsu (JP); Minoru Kubo, Nabari (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/979,258

(22) PCT Filed: Mar. 23, 2001

(86) PCT No.: PCT/JP01/02381
§ 371 (c)(1),
(2), (4) Date: Nov. 21, 2001

(87) PCT Pub. No.: WO01/71785
PCT Pub. Date: Sep. 27, 2001

(65) Prior Publication Data
US 2002/0160605 A1 Oct. 31, 2002

(30) Foreign Application Priority Data
Mar. 23, 2000 (JP) ........................................ 2000-081201

(51) Int. Cl.$^7$ .......................... H01L 21/20; H01L 21/36
(52) U.S. Cl. .................................................... 438/488
(58) Field of Search ........................ 438/488, 489–491, 438/478–487

(56) References Cited

U.S. PATENT DOCUMENTS 5,906,680 A 5/1999 Meyerson

FOREIGN PATENT DOCUMENTS

| JP | 06-224127 | 8/1994 |
| JP | 9-283533 A | 10/1997 |

OTHER PUBLICATIONS

H.J. Osten et al., *Substitional carbon incorporation in epitaxial $Si_{1-y}C_y$ alloys on Si(001) grown by molecular beam epitaxy*, Appl. Phys. Lett., 74(6), pp. 836–838, Feb. 1999.

International Search Report dated Jun. 26, 2001.

C. W. Liu, "Substitutional carbon reduction in SiGeC alloys grown by rapid thermal chemical vapor deposition", Appl. Phys. Lett., vol. 75, No. 15, pp. 2271 to 2273, (1999).

C. W. Liu, "Growth and photoluminescence of high quality SiGeC random alloys on silicon substrates", J. Appl. Phys., vol. 80, No. 5, pp. 3043 to 3047, (1996).

J. Mi, "High quality $Si_{1-x-y}Ge_xC_y$ epitaxial layers grown on (100) Si by rapid thermal chemical vapor deposition using methylsilane", Appl. Phys. Lett., vol. 67, No. 2, (1995), p. 1, left col., lines 17 to 27.

J. Kouvetakis, "Novel chemical routes to silicon–germanium–carbon materials", Appl. Phys. Lett., vol. 65, No. 23, pp. 2960 to 2962, (1994).

International Search Report dated Jun. 14, 2001.

J.L. Hoyt et al., "Comparison of $Si/Si_{1-x-y}Ge_xC_y$ and $Si/si_{1-y}C_y$ heterojunctions grown by rapid thermal chemical vapor deposition", Thin Solid Films 321, pp. 41–46, 1998.

Jian Mi et al., "Epitaxial growth of $Si_{1-x-y}Ge_xC_y$ alloy layers on (100) Si by rapid thermal chemical vapor deposition using methylsilane", J. Vac. Sci. Technol. B 14(3), pp. 1660–1669, May/Jun., 1996.

*Primary Examiner*—Craig Thompson
(74) *Attorney, Agent, or Firm*—McDermott, Will & Emery

(57) ABSTRACT

After the surface of a Si substrate (1) has been pretreated, an SiGeC layer (2) is formed on the Si substrate (1) using an ultrahigh vacuum chemical vapor deposition (UHV-CVD) apparatus. During this process step, the growth temperature of the SiGeC layer (2) is set at 490° C. or less and $Si_2H_6$, $GeH_4$ and $SiH_3CH_3$ are used as Si, Ge and C sources, respectively, whereby the SiGeC layer (2) with good crystallinity can be formed.

6 Claims, 3 Drawing Sheets

PRODUCTION METHOD FOR SEMICONDUCTOR CRYSTAL

TECHNICAL FIELD

The present invention relates to a method for producing a semiconductor crystal made of silicon (Si) atoms, germanium (Ge) atoms and carbon (C) atoms.

BACKGROUND ART

A mixed crystal semiconductor (SiGe) made of Si and Ge is well known as a material which forms a heterostructure with Si and from which an ultra-fast semiconductor device can be fabricated. However, SiGe has a lattice constant greater than Si. Thus, when an SiGe layer is epitaxially grown on a Si layer, a very large compressive strain is caused in the SiGe layer. For this reason, when the thickness of the SiGe layer deposited on the Si layer exceeds a thickness (critical thickness), a phenomenon, in which the strain in the SiGe crystal is relieved with generation of defects such as dislocations in the crystal, occurs. Even though no defects are observed immediately after the crystal growth, when a thermal treatment, which is essential for semiconductor processing, is carried out, defects are apt to be caused particularly in the SiGe crystal having a high Ge content. In other words, the SiGe crystal has low resistance to heat, which is an unfavorable property from the viewpoint of fabricating devices. In addition, an energy band offset appears only at the valence band of the SiGe layer around an Si/SiGe heterojunction. Therefore, since carriers are confined only in the valence band, in forming an MOS transistor in which the SiGe layer in an Si/SiGe structure is used as a channel, only a p-channel transistor having positive holes as carriers can be fabricated.

With regard to compensating for the above drawbacks of an $Si_{1-x}Ge_x$ crystal, it is a mixed crystal semiconductor (SiGeC) made of Si, Ge and C that has been considered particularly important in recent years. C is an element having a smaller atomic radius as compared to Si and Ge. By introducing C into a crystal, the crystal can have its lattice constant decreased and its strain lessened. Since this allows the amount of strain accumulated in the crystal to be reduced, its resistance to heat can also be increased. In addition, when Ge and C contents are increased (several tens percent of Ge and several percent of C) in an SiGeC layer around an Si/SiGeC heterojunction, the offset of energy band can be produced at both the valence band and conduction band of the SiGeC layer. In this case, carriers are confined in both the conductive band and the valence band, thus enabling the fabrication of not only a p-channel transistor but also an n-channel transistor.

Further, C introduced into an SiGe layer functions effectively to suppress the diffusion of an impurity such as boron. In this case, an SiGeC crystal having a C content of about 0.1% or less is used.

The SiGeC crystal cannot be formed by a method performed in a thermally equilibrium state, such as a melt growth method. Therefore, as will be described later, a crystal growing technique performed in a thermally non-equilibrium state, such as a molecular beam epitaxy (MBE) process or a chemical vapor deposition (CVD) process, for example, has been conventionally utilized for forming the SiGeC crystal.

The MBE process is a process in which source atoms are evaporated and transported to a substrate at 300–500° C. under ultrahigh vacuum conditions so as to grow a crystal on the substrate. However, this process has drawbacks; sources needs to be changed, the crystal cannot be formed on a face with minute unevenness, and it is difficult for the substrate to have a large diameter, for example. Hence, this process is not suitable for the mass-production of the SiGeC crystal.

Next, as the CVD process, a rapid thermal chemical vapor deposition (RT-CVD) process or a limited reaction processing (LRP) is usually used. The CVD process is a process in which a crystal is grown on a heated substrate by introducing source gases with a large quantity of hydrogen in a medium to high vacuum. In forming the SiGeC crystal, silane ($SiH_4$) is mainly used as a Si source, $GeH_4$ is used as a Ge source, and monomethylsilane ($SiH_3CH_3$), ethylene ($C_2H_4$) or acetylene ($C_2H_2$), for example, is used as a C source. Conventionally, the crystal is grown under temperature conditions of 550–600° C. as in the case of growing an SiGe layer.

Problems to be Solved

The SiGeC crystal, in which strain and band offset can be controlled much more freely, is a material which can realize more various devices of higher quality than an SiGe crystal. However, it is not easy to produce the SiGeC crystal because of the following properties thereof.

First, the solid solubility of C atoms in Si and Ge is very low (about $10^{17}/cm^3$ and about $10^8/cm^3$ in Si and Ge, respectively, in a thermally equilibrium state). Thus, it is impossible to produce an SiGe crystal having a high C content (percent order) by a melt growth method, for example, performed in a thermally equilibrium state.

Also, due to their properties, it is likely for C atoms to enter not only the lattice sites but also the interstitials of the crystal. The C atoms that have entered the crystal interstitials become a carrier recombination center, which presumably adversely affects the characteristics of devices.

Further, since the C atoms tend to selectively bond with Si atoms in the SiGeC crystal, crystalline silicon carbide (SiC) is apt to be produced locally. Moreover, amorphous-SiC-like structures can be formed. Moreover, depending on crystal growth conditions, precipitates of C atoms are likely caused. Such local structures result in decrease in crystallinity.

Hence, it is very difficult to epitaxially grow, on a Si layer, an SiGeC crystal having a relatively high C content and homogeneity (with no local structure such as SiC crystal, for example) applicable to semiconductor devices, i.e., an SiGeC layer of high quality with a relatively high C content and a low defect density.

For example, it was difficult to form an SiGeC crystal of high quality with a high C content and a low defect density even by the CVD process performed in a thermally non-equilibrium condition.

DISCLOSURE OF INVENTION

An object of the present invention is providing a method for growing, on a substrate, an SiGeC crystal applicable to a semiconductor device, which has homogeneity (with no local structure such as SiC crystal) and good crystallinity.

A method for producing a semiconductor crystal in accordance with the present invention includes the steps of: (a) introducing a source gas containing silicon (Si), a source gas containing germanium (Ge) and a source gas containing carbon (C) into a container in which a substrate is held; and (b) thermally dissolving the source gases, thereby producing a semiconductor crystal containing Si atoms, Ge atoms and C atoms on the substrate. In the method, the thermal dissolution step is carried out at a temperature of 490° C. or less.

By the above method, it is possible to form, on the substrate, a semiconductor crystal containing Si, Ge and C, with good crystallinity.

In the method described above, the semiconductor crystal is formed by a thermal CVD process. By this method, a semiconductor crystal with good crystallinity can be efficiently formed on the substrate. Further, a semiconductor crystal with good crystallinity can also be formed on a substrate including a patterned member.

In the method described above, $Si_2H_6$ or $Si_3H_8$ is used as a source gas of Si to be contained in the semiconductor crystal. By this method, a growth rate of about 4–8 nm/min can be achieved for the semiconductor crystal even at a low temperature of 490° C. or less. Hence, it is possible to mass-produce a semiconductor device including the semiconductor crystal having good crystallinity.

BEST MODE FOR CARRYING OUT THE INVENTION

A best embodiment of the present invention will be described with reference to the accompanying drawings.

Figure 1A:
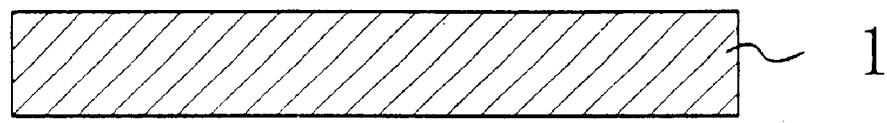
FIGS. 1A and 1B are cross-sectional views illustrating process steps for forming an SiGeC layer in accordance with an embodiment of the present invention.
Figure 1B:
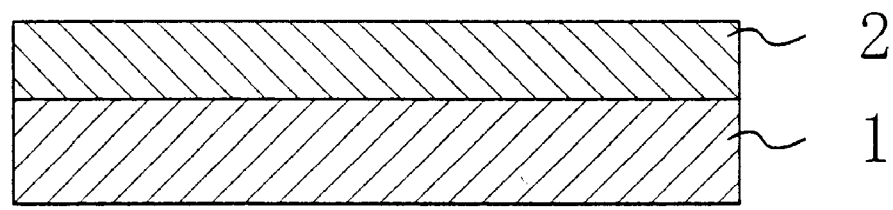

FIGS. 1A and 1B are views illustrating process steps for forming an SiGeC layer on an Si substrate by using a thermal CVD process.

In the process step shown in FIG. 1A, an Si substrate 1 is first pretreated. In growing a crystal such as SiGeC, for example, on the Si substrate 1, the pretreatment for the Si substrate 1 is very important and thus has to be carried out indispensably. In this embodiment, an Si wafer in (001) plane is used for the substrate.

First, the surface of the Si substrate 1 is cleaned with a mixed solution of sulfuric acid-hydrogen peroxide aqueous solution, to remove organic substances and metallic contaminants on the surface of the Si substrate 1. The surface of the Si substrate 1 is then cleaned with a solution of ammonia-hydrogen peroxide aqueous solution, to remove small particles attached onto the surface of the Si substrate 1. Subsequently, a naturally-oxidized film on the surface of the Si substrate 1 is removed with hydrofluoric acid. The resultant Si substrate 1 is immersed in the solution of ammonia-hydrogen peroxide aqueous solution again, to form a thin protection oxide film on the surface of the Si substrate 1.

Next, in the step shown in FIG. 1B, the pretreated Si substrate 1 is loaded into a crystal growth apparatus. In this embodiment, an ultrahigh vacuum chemical vapor deposition (UHV-CVD) apparatus is used as the crystal growth apparatus. In this method for producing a semiconductor crystal, the crystal is grown in an ultrahigh-vacuum back pressure of $1.3\times10^{-8}$ Pa ($1.0\times10^{-10}$ Torr) or lower. In this embodiment, the Si substrate 1 is loaded into a crystal growth chamber and pressure in the crystal growth chamber is then temporally reduced to as low as $2.66\times10^{-7}$ Pa ($2.0\times10^{-9}$ Torr).

Thereafter, the Si substrate 1 is heated to 850° C. in a hydrogen gas atmosphere, to remove the protection oxide film formed on the Si substrate 1 and thus expose the cleaned surface of the Si substrate 1.

Subsequently, the temperature of the Si substrate 1 is decreased to 490° C., at which the crystal will be grown, and source gases are introduced, to grow an SiGeC layer 2 having a thickness of about 100 nm on the Si substrate 1. Although the crystal is grown at 490° C. in this embodiment, the SiGeC layer having high crystallinity can be formed at a temperature from about 300° C., at which the source gases can be dissolved, to 490° C., inclusively.

$Si_2H_6$, which is relatively easy to be dissolved at a low temperature, is used as a Si source gas, and $GeH_4$ and $SiH_3CH_3$ are respectively used as Ge and C sources. The respective pressures of the gases, which are $9.1\times10^{-3}$ Pa ($7\times10^{-5}$ Torr) for $Si_2H_6$, $4.2\times10^{-2}$ Pa ($3\times10^{-4}$ Torr) for $GeH_4$, and $1.1\times10^{-3}$ Pa ($9\times10^{-6}$ Torr) for $Si_3H_8$, are kept constant.

In addition to $Si_2H_6$, $Si_3H_8$ which is dissolved at a low temperature may also be used as the Si source gas. However, silane ($SiH_4$), which is normally used as a Si source gas, is not used in this embodiment because silane crystal cannot be grown efficiently at a low temperature (about 490° C.). Also, the pressures of the gases used in this embodiment are set lower as compared to conventional pressure conditions in known methods for growing an SiGeC crystal. The reason for this is that because the source gas such as $Si_2H_6$ is an explosive gas, it is favorable, from a safety standpoint, for the source gases to have the reduced pressure during the process step of growing the SiGeC crystal. In addition, the reduced pressure of the source gases leads to the saving of the source gases, hence also allowing advantageous costs.

In this embodiment, the ultrahigh vacuum chemical vapor deposition apparatus (UHV-CVD apparatus) is used to grow the SiGeC layer 2 on the Si substrate 1. Alternatively, an LRP apparatus or a RT-CVD apparatus may be used.

Although the Si wafer in (001) plane is used for the substrate in this embodiment, a Si wafer having a different crystal face may be used. The SiGeC layer with high crystallinity can also be formed on a substrate including a patterned member. By following the above process steps, the SiGeC layer 2 with high crystallinity can be formed on the Si substrate 1.

In this embodiment, the SiGeC crystal is grown at 490° C. The temperature was determined from the following analysis performed for the purpose of finding the most suitable temperature for the crystal growth.

First, the pretreatment of Si substrates was performed in the same manner as in this embodiment, and SiGeC layers were then deposited on the respective Si substrates using an UHV-CVD process. Crystals were grown at temperatures ranging from 480° C. to 520° C. As for source gases, $Si_2H_6$, $GeH_4$ and $SiH_3CH_3$ were used as sources of Si, Ge and C, respectively, as in this embodiment, and the respective pressures of the gases were also the same as those in this embodiment.

Figure 2:
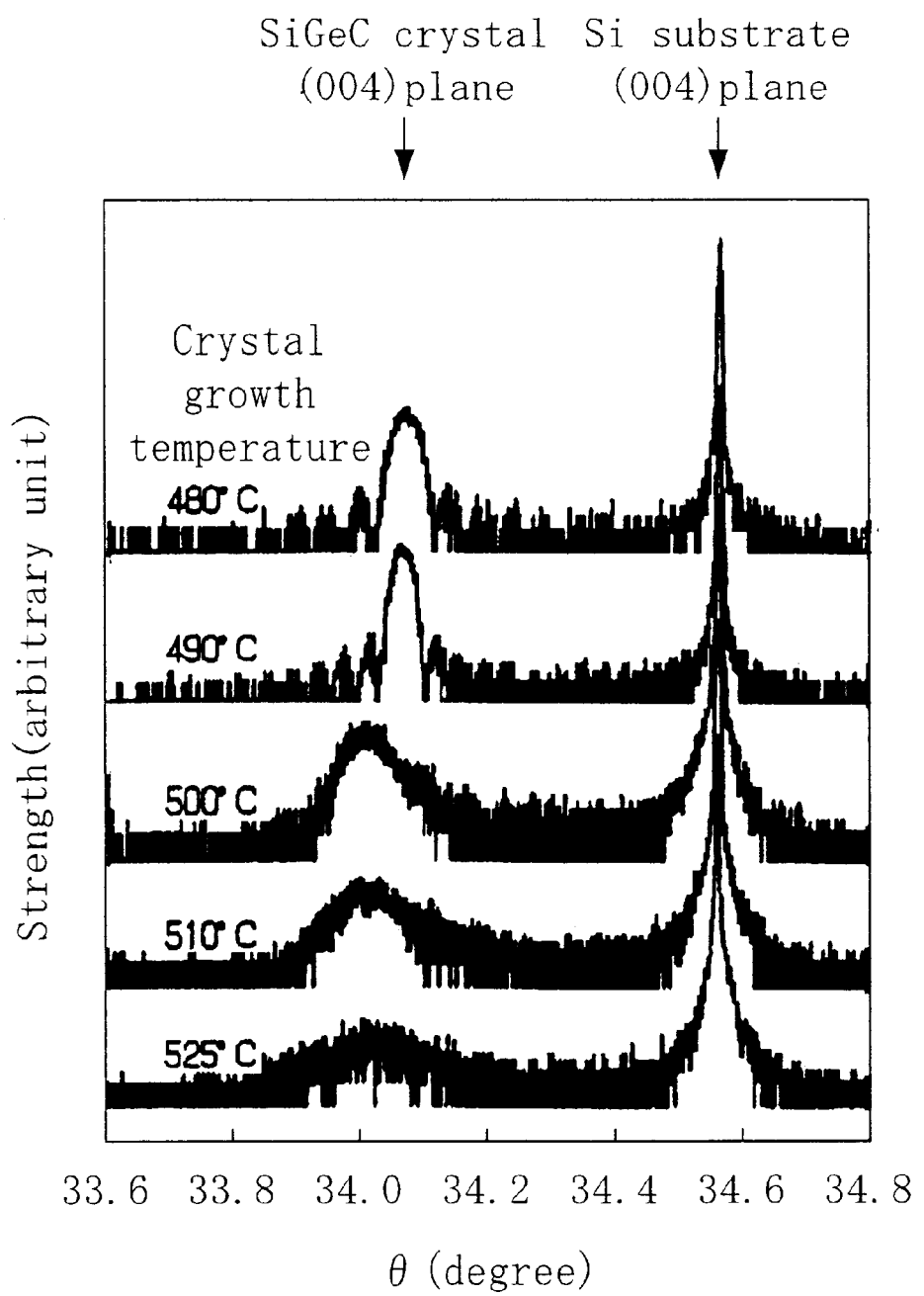
FIG. 2 illustrates the X-ray diffraction spectra in the SiGeC layers grown at temperatures of 480–525° C.

Next, the crystallinity of the respective SiGeC layers in samples fabricated by the above process steps was examined by measuring the X-ray diffraction spectra. The results are shown in FIG. 2. The thickness of the SiGeC layers in the samples was set at about 100 nm.

In FIG. 2, peaks near 34.56 degrees observed in all the samples were those caused by diffraction from (004) planes of Si used as the substrates and were not related to the epitaxially grown SiGeC layers. The peaks of the SiGeC layers to be noted in FIG. 2 are those appearing between 34.0 and 34.1 degrees.

In FIG. 2, the diffraction peak caused by the (004) planes of the SiGeC crystal is observed near an angle of 34.0 degrees in the spectrum of the sample grown at 525° C. However, the peak is very broad and is also low in strength. It is known that in general the peak strength and half-width (a peak width at half peak strength) in an X-ray diffraction spectrum have a very strong correlation with crystallinity. Specifically, when the crystallinity is good, the peak strength increases and the half-width narrows. On the other hand, when the crystallinity is bad, the peak strength decreases and the half-width tends to expand. In view of this, the SiGeC layer of the sample grown at 525° C. presumably had a very low crystallinity and many defects and the like presumably existed in the crystal.

From observation of the crystal surface by Nomarski microscope, also, surface roughness was found in the SiGeC layer of the sample grown at 525° C. and the surface state thereof was found to be very bad (not shown).

Next, where the growth temperatures were decreased to about 510° C.–500° C., the peak strengths slightly increased, but the half-widths were still large. In view of this, the crystallinity was improved to some extent in the SiGeC layers of the samples grown at about 510° C.–500° C., as compared to the SiGeC layer of the sample grown at 525° C. However, it is unlikely that the crystallinity was so high as to allow the SiGeC layers grown at about 510° C.–500° C. to be used as an active region of a semiconductor device. Also, from observation of the surfaces of the samples grown at about 510° C.–500° C. by Nomarski microscope, it was found that the surface state had not been improved (not shown).

However, where the temperature of the SiGeC layer was decreased to 490° C., the shape of the peak changed drastically and the very sharp peak appeared near 34.05 degrees. Further, many small peaks are observed before and after the peak near 34.05 degrees in the spectrum of the SiGeC layer grown at a temperature of 490° C. These small peaks, which constitute a fringe in the X-ray diffraction image, can be observed only in a crystal having considerably high crystallinity. From these facts, it is found that the SiGeC layer of the sample grown at 490° C. had good crystallinity.

Further, a diffraction peak as sharp as that in the SiGeC layer grown at 490° C. is also observed in the SiGeC layer of the sample grown at 480° C. in substantially the same diffraction angle position. This indicates that the crystallinity of the SiGeC layer grown at 480° C. was very good and that the content of C atoms which had entered the lattice sites did not change from that in the sample grown at 490° C. The compositions of the samples grown at 490° C. and 480° C. were estimated using Vegard's Law. As a result, it was found that the SiGeC layers having high Ge and C contents, i.e., 30.0% of Ge atoms and 1.2% of C atoms, had been produced. In close observation of the respective surfaces of the samples produced at 490° C. and 480° C. by Nomarski microscope, also, no roughness was observed in the respective surfaces of the SiGeC layers and it was found that the surface states had been improved (not shown).

Vegard's Law is a law regarding relation between the lattice constant and mixture ratio of a mixed crystal. According to this law, the lattice constant $A_{SiGe}$ of an $Si_xGe_{1-x}$ crystal having a Si content x and a Ge content (1–x), for example, is expressed by $A_{SiGe} = xA_{Si} + (1-x)A_{Ge}$ where the lattice constants of Si and Ge are $A_{Si}$ and $A_{Ge}$, respectively. If the lattice constants of the respective crystals are found, the composition of the mixed crystal can be obtained using the lattice constants.

Then, relation between the crystallinity and growth temperature of various SiGeC layers having different Ge and C contents with each other was considered. The Ge and C contents in the SiGeC layers were controlled by changing the pressures of $GeH_4$ and $SiH_3CH_3$ while the pressure of $Si_2H_6$ was kept constant. Other conditions were the same as in this embodiment. A summary of the results is shown in FIG. 3.

Figure 3:
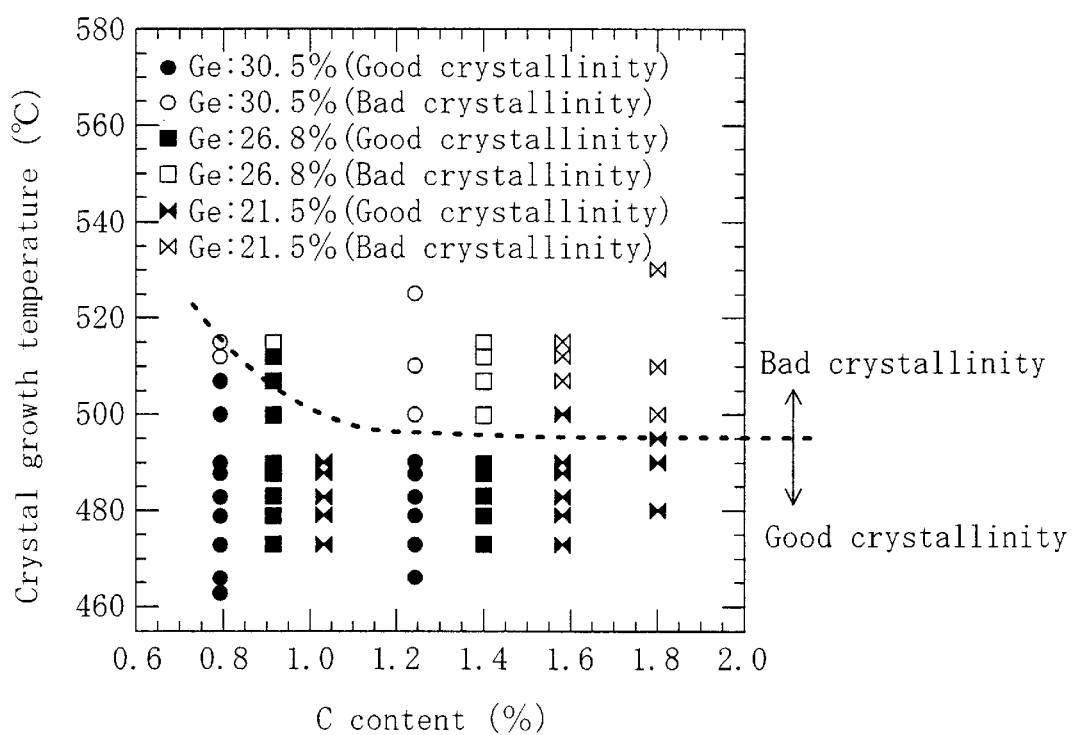
FIG. 3 illustrates relation between the crystallinity and growth temperature in various SiGeC layers having different Ge and C contents with each other.

FIG. 3, in which the ordinate indicates the growth temperature of the SiGeC layers while the abscissa indicates the C content in the SiGeC layers produced, shows whether the respective crystallinities were good or bad. In determining whether the crystallinities were good or bad, the X-ray diffraction spectra were measured and observations by Nomarski microscope were performed as in the above method. In FIG. 3, the differences in Ge content are indicated with different marks, and the solid marks indicate good crystallinity and the open marks indicate bad crystallinity.

For example, the circles ○ or ● plotted in the part of FIG. 3 where the C content represented by the abscissa is near 1.2%, show the results of the cases where the SiGeC layers containing 30.5% of Ge and 1.2% of C were produced and indicate that the crystallinities were good (●) when the growth temperatures were 490° C. or less and that the crystallinities were bad (○) at 500° C. or more. Also, it is the SiGeC layers containing Ge at 26.8% and C at 1.4% that are indicated by □ or ■ located in the part where the C content is 1.4%. In this case, also, it is indicated that the crystallinities were good (■) at 490° C. or less while the crystallinities were not good (□) when the growth temperature exceeded that. The dotted line in FIG. 3 is an approximation curve made by connecting the growth temperatures respectively located on boundaries where the crystallinity became good from bad in the respective SiGeC layers having different C contents.

Considering the overall results, it is found that whether the crystallinity is good or bad does not depend on the Ge content greatly but changes at the boundary located in the temperature range of 490° C. to 500° C., with some variations. In other words, the results clearly show that when the growth temperature of the SiGeC layers exceeds this temperature range, the crystallinity of the SiGeC layers deteriorates and that if the growth temperature of the SiGeC layers is lower than this temperature range, the crystallinity of the SiGeC layers increases. Particularly, in the SiGeC samples having a C content greater than 1%, all the SiGeC samples showed the good crystallinity when the growth temperature of the SiGeC layers was lower than 490° C.

In the SiGeC layers having a C content smaller than 1%, the smaller the C content is, the higher the boundary temperature at which the crystallinity changes from good to bad becomes.

Hereinafter, it will be discussed why the good crystallinity could be obtained where the temperature for the crystal growth was reduced to as low as about 490° C. According to a paper (J. Mi et al., J. Vac. Sci. Technol. B14,166,'96), $SiCH_4$ is presumably generated as an intermediate product in a process in which C atoms are incorporated into a growing SiGeC crystal. Where a temperature for the crystal growth is low, the intermediate product, which unlikely moves about on the surface of the growing crystal, is presumably decomposed on the surface site and incorporated in the lattice sites of the crystal as Si or C atoms. And it is considered that the Si and C atoms, which once have been incorporated in the lattice sites of the crystal, are unlikely to leave because the temperature is low. However, where the temperature for the crystal growth is high, the intermediate product of $SiCH_4$ is likely to move about on the growing surface and presumably prevents normal crystal growth by entering the interstitials and the like. Also, even after the intermediate product has been decomposed on the surface site and once incorporated into the surface of the epitaxially growing crystal, the intermediate product is likely to leave the surface easily due to thermal energy and enter the interstitial sites or the like to prevent the normal crystal growth. Therefore, by combining the results obtained in the above discussion, it is considered that the crystallinity became bad at the growth temperatures exceeding 490° C. because $SiCH_4$ easily moved about and also the C atoms in the lattice sites easily left.

From the above results, it can be determined that an SiGeC crystal having good crystallinity can be produced by reducing the growth temperature of the crystal to 490° C. or less even under the condition that the pressure of a Si source gas is low. Particularly, in order to produce an SiGeC crystal having a C content greater than 1% with good crystallinity, it is effective to grow the crystal at a low temperature such as 490° C. or less. From these results, the temperature condition for the crystal growth in this embodiment has been obtained.

Generally, in growing a semiconductor crystal using a CVD process, for example, if a growth temperature is set low, there exists a problem that the growth rate of the crystal is decreased, resulting in decreased throughput during the process step of growing the crystal.

However, in this embodiment, $Si_2H_6$, which is easily dissolved at a low temperature, is used as a Si source gas instead of $SiH_4$ which has been the mainstream conventionally. Thus, where the SiGeC crystal is produced at 490° C., a crystal growth rate of about 4–8 nm/min, which stands comparison with that obtained in the case of producing an SiGe crystal by a mass production-type growth apparatus, can be realized. Hence, there will be no problem that is associated with the growth rate, in mass-producing the crystal.

According to the present invention, an SiGeC crystal having good crystallinity can be formed. Thus, n-channel and p-channel MOS transistors operating at an ultra high speed can be fabricated by depositing an SiGeC layer on a Si substrate in accordance with this embodiment and then depositing a Si layer on the SiGeC layer and forming a gate electrode on the Si layer, for example.

INDUSTRIAL APPLICABILITY

The method for producing a semiconductor crystal in accordance with the present invention can be utilized for fabricating various types of devices which are required to operate at a high speed, such as n-channel and p-channel MOS transistors which operate at an ultra high speed.

What is claimed is:

1. A method for producing a semiconductor crystal, comprising the steps of:

(a) introducing a source gas containing silicon (Si), a source gas Containing germanium (Ge) and a source gas containing carbon (C) into a container in which a substrate is held; and (b) thermally dissolving the source gases, thereby producing a semiconductor crystal containing Si atoms, Ge atoms and C atoms on the substrate, wherein the thermal dissolution step is carried out at a temperature between 300° C. to 490° C.

2. A method for producing a semiconductor crystal according to claim 1, characterized in that the semiconductor crystal is formed by a thermal CVD process.

3. A method for producing a semiconductor crystal according to claim 1 or 2, characterized in that $Si_2H_6$ or $Si_3H_8$ is used as a source gas of Si to be contained in the semiconductor crystal.

4. A method for producing a semiconductor crystal according to claim 1, characterized in that the amount of carbon (C) contained in the semiconductor crystal is 0.8% or more.

5. A method for producing a semiconductor crystal according to claim 1, characterized in that the amount of carbon (C) contained in the semiconductor crystal is 1.0% or more.

6. A method for producing a semiconductor crystal according to claim 1, characterized in that the amount of carbon (C) contained in the semiconductor crystal is 1.8% or less.

* * * * *